United States Patent
Makiuchi et al.

(10) Patent No.: US 10,274,341 B2
(45) Date of Patent: Apr. 30, 2019

(54) MAGNETIC SHIELD COVER FOR ENCODER OF MAGNETIC DETECTION TYPE AND ENCODER OF MAGNETIC DETECTION TYPE

(71) Applicant: SANYO DENKI CO., LTD., Tokyo (JP)

(72) Inventors: Kazuhiro Makiuchi, Tokyo (JP); Yoshihiro Shoji, Tokyo (JP)

(73) Assignee: SANYO DENKI CO., LTD., Tokyo (JP)

( * ) Notice: Subject to any disclaimer, the term of this patent is extended or adjusted under 35 U.S.C. 154(b) by 0 days.

(21) Appl. No.: 14/633,905

(22) Filed: Feb. 27, 2015

(65) Prior Publication Data

US 2015/0253155 A1 Sep. 10, 2015

(30) Foreign Application Priority Data

Mar. 4, 2014 (JP) ................................. 2014-042044

(51) Int. Cl.
- *G01D 5/12* (2006.01)
- *G01D 5/244* (2006.01)
- *G01D 11/24* (2006.01)
- *G01R 15/20* (2006.01)

(52) U.S. Cl.
CPC ........... *G01D 5/12* (2013.01); *G01D 5/24442* (2013.01); *G01D 11/245* (2013.01); *G01R 15/207* (2013.01)

(58) Field of Classification Search
CPC ......................... G01D 5/24442; G01R 15/207
See application file for complete search history.

(56) References Cited

U.S. PATENT DOCUMENTS

| 3,767,929 A * | 10/1973 | Shohet | H05H 1/0006 250/362 |
| 4,959,574 A * | 9/1990 | Suzuki | G01D 5/142 156/275.7 |
| 5,637,995 A * | 6/1997 | Izawa | G01D 5/145 324/174 |
| 6,124,710 A * | 9/2000 | Kordecki | G01D 5/145 310/68 B |

(Continued)

FOREIGN PATENT DOCUMENTS

| CN | 101646931 A | 2/2010 |
| DE | 102009051978 A1 | 5/2011 |

(Continued)

OTHER PUBLICATIONS

Extend European Search Report dated Jul. 21, 2015 for the corresponding European Patent Application No. 15157579.2.

(Continued)

*Primary Examiner* — Son T Le
*Assistant Examiner* — Dustin R Dickinson
(74) *Attorney, Agent, or Firm* — Rankin, Hill & Clark LLP

(57) ABSTRACT

A magnetic shield cover for an encoder of magnetic detection type includes a soft magnetic section and a non-magnetic section. The soft magnetic section is formed to cover a magnetic detection element and a magnet and has an opening for avoiding a situation that a part of the soft magnetic section prevents a magnetic field from the magnet from passing through the magnetic detection element. The non-magnetic section is provided in the opening of the soft magnetic section.

11 Claims, 5 Drawing Sheets

(56) References Cited

U.S. PATENT DOCUMENTS

| | | | |
|---|---|---|---|
| 6,593,733 B1* | 7/2003 | Nicot | F16C 41/04 |
| | | | 324/207.25 |
| 8,847,584 B2 | 9/2014 | Wirth | |
| 2003/0094941 A1* | 5/2003 | Mizutani | G01D 5/145 |
| | | | 324/207.2 |
| 2004/0032345 A1* | 2/2004 | Kazuya | G01D 5/04 |
| | | | 341/15 |
| 2006/0016274 A1* | 1/2006 | Hattori | G01D 11/245 |
| | | | 73/862.08 |
| 2008/0164867 A1* | 7/2008 | Steinich | G01D 5/145 |
| | | | 324/207.2 |
| 2009/0107259 A1* | 4/2009 | Ishihara | B62D 6/10 |
| | | | 73/862.193 |
| 2010/0052663 A1 | 3/2010 | Theil | |
| 2010/0071481 A1 | 3/2010 | Arita | |
| 2010/0162831 A1* | 7/2010 | Kubokawa | F16C 41/007 |
| | | | 73/862.381 |
| 2011/0080162 A1 | 4/2011 | Wirth | |
| 2012/0126796 A1* | 5/2012 | Drespling | G01D 5/145 |
| | | | 324/207.2 |
| 2014/0230545 A1* | 8/2014 | Geer | G01D 11/245 |
| | | | 73/431 |
| 2015/0323346 A1 | 11/2015 | Maiterth | |

FOREIGN PATENT DOCUMENTS

| | | |
|---|---|---|
| JP | 07-035572 | 2/1995 |
| JP | H11-023213 A | 1/1999 |
| JP | 2008185560 A2 | 8/2008 |
| JP | 2010-139351 A | 6/2010 |
| JP | 5082473 A2 | 11/2012 |
| WO | 2014072225 A1 | 5/2014 |

OTHER PUBLICATIONS

Japanese Office Action dated Sep. 26, 2017 for the corresponding Japanese Patent Application No. 2014-042044, 3 pages.

Japanese Office Action (JPOA) dated Mar. 26, 2018 for the corresponding Japanese Patent Application No. 2014-042044.

Chinese Office Action (CNOA) dated Mar. 29, 2018 for the corresponding Chinese Patent Application No. 201510064153.7.

* cited by examiner

MAGNETIC SHIELD COVER FOR ENCODER OF MAGNETIC DETECTION TYPE AND ENCODER OF MAGNETIC DETECTION TYPE

CROSS-REFERENCE TO RELATED APPLICATION

This application claims priority from Japanese Patent Application No. 2014-042044 filed with the Japan Patent Office on Mar. 4, 2014, the entire content of which is hereby incorporated by reference.

BACKGROUND

1. Technical Field

The present disclosure relates to a magnetic shield cover for an encoder of magnetic detection type and an encoder of magnetic detection type that includes the magnetic shield cover.

2. Description of the Related Art

An encoder of magnetic detection type is operated by using magnetism. Thus, when the encoder is influenced by an external magnetic field, an erroneous operation thereof possibly occurs. In order to shield the external magnetic field, an encoder chamber of the encoder of magnetic detection type is covered with a magnetic shield cover. The magnetic shield cover is usually formed of a soft magnetic body such as an iron-based material.

Art related to the magnetic shield cover is disclosed in JP-A-7-35572, for example. A magnetic encoder described in this literature has: a cover that covers a signal processing circuit, a magnetic detector, and a magnetic drum; and a bracket for fixing this cover. The bracket and the cover are each formed of the soft magnetic body.

According to the magnetic encoder described in JP-A-7-35572, because the bracket and the cover are each formed of the soft magnetic body, leaked magnetic flux that acts from the outside can be shielded.

SUMMARY

A magnetic shield cover for an encoder of magnetic detection type includes a soft magnetic section and a non-magnetic section. The soft magnetic section is formed to cover a magnetic detection element and a magnet and has an opening for avoiding a situation that a part of the soft magnetic section prevents a magnetic field from the magnet from passing through the magnetic detection element. The non-magnetic section is provided in the opening of the soft magnetic section.

DESCRIPTION OF THE EMBODIMENTS

Figure 1:
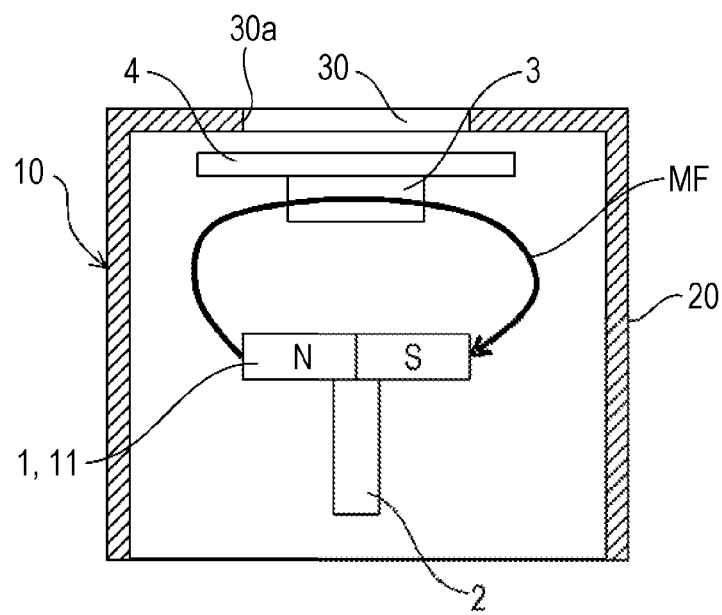
FIG. 1 is a vertical cross-sectional view of an encoder of magnetic detection type according to a first embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In order to shield an influence of external magnetism, a conventional magnetic shield cover that is formed of a soft magnetic body such as an iron-based material uniformly surrounds an encoder chamber with a gap being hardly present. This causes an overall weight increase of an encoder.

In addition, when the magnetic shield cover is located near a magnetic detection element, magnetic flux that should be used for an operation of the magnetic detection element is drawn into the magnetic shield cover. This influences a magnetic detection characteristic of the magnetic detection element. In order to suppress such an influence, a sufficient distance is secured between the magnetic detection element and the magnetic shield cover. For this reason, in a conventional structure, there is limitation on size reduction of an encoder of magnetic detection type.

An object of the present disclosure is to provide a magnetic shield cover for an encoder of magnetic detection type and an encoder of magnetic detection type that includes the magnetic shield cover, the magnetic shield cover being less likely to influence a magnetic field that is used for an operation of a magnetic detection element and being able to shield an external magnetic field.

In addition, another object of the present disclosure is to provide a magnetic shield cover for an encoder of magnetic detection type and an encoder of magnetic detection type that includes the magnetic shield cover, the magnetic shield cover and the encoder of magnetic detection type being lightweight.

A magnetic shield cover for an encoder of magnetic detection type (the present magnetic shield cover) according to the present disclosure includes a soft magnetic section and a non-magnetic section. The soft magnetic section is formed to cover a magnetic detection element and a magnet and has an opening for avoiding a situation that a pan of the soft magnetic section prevents a magnetic field from the magnet from passing through the magnetic detection element. The non-magnetic section is provided in the opening of the soft magnetic section.

The present magnetic shield cover has: the soft magnetic section through which magnetic flux is likely to pass; and the non-magnetic section through which the magnetic flux is less likely to pass. The soft magnetic section may be arranged in a portion that is less likely to influence an operational magnetic field of the magnetic detection element, for example. The non-magnetic section may be arranged in an area where a magnetic field used for an operation of the magnetic detection element is formed.

The magnetic detection element and the magnet for forming the magnetic field used for the operation of the magnetic detection element are, for example, arranged such that the appropriate operational magnetic field can be generated in a state that the magnetic shield cover is not provided.

In the case where the soft magnetic section is arranged near the magnetic detection element, the magnetic flux that is formed by the magnet and should be used for the operation of the magnetic detection element (the magnetic flux that should pass through the magnetic detection element) is possibly drawn into the soft magnetic section. This possibly influences the operation of the magnetic detection element. Thus, in the present magnetic shield cover, the soft magnetic section has an opening for avoiding a situation that a part of the soft magnetic section prevents the magnetic field from the magnet from passing through the magnetic detection element. Furthermore, the non-magnetic section is provided in the opening of the soft magnetic section.

Accordingly, in the present magnetic shield cover, the non-magnetic section is arranged in the area into which the magnetic field that is formed by the magnet and should be used for the operation of the magnetic detection element (the magnetic field that should pass through the magnetic detection element) is likely to be drawn.

In the above configuration, unlike the background art, the encoder chamber is not completely surrounded by the soft magnetic body. Thus, partial degradation of magnetic shield performance against a magnetic field from the outside is concerned. However, the inventors have confirmed from an experiment that, in comparison with the conventional magnetic shield cover that is structured to uniformly surround the encoder chamber by the soft magnet body, the present magnetic shield cover can exhibit further favorable shield performance against the magnetic field from the outside by appropriately arranging the soft magnetic section and the non-magnetic section in accordance with a characteristic of the magnetic detection element arranged therein, for example.

The present magnetic shield cover has the soft magnetic section and the non-magnetic section. The soft magnetic section may be arranged in a portion that is less likely to influence the operational magnetic field of the magnetic detection element, for example. The non-magnetic section may be arranged in the area where the magnetic field used for the operation of the magnetic detection element is formed.

Thus, even when a distance between the magnetic shield cover and the magnetic detection element is reduced, the present magnetic shield cover is less likely to influence the magnetic field used for the original operation of the magnetic detection element. In addition, the present magnetic shield cover can shield the external magnetic field.

Furthermore, the non-magnetic section may be lighter in weight than the soft magnetic body. In this case, it is possible to reduce a weight of the present magnetic shield cover in comparison with a structure completely surrounding the encoder chamber by the soft magnetic body.

A description will hereinafter be made on a magnetic shield cover for an encoder of magnetic detection type and an encoder of magnetic detection type that includes the magnetic shield cover according to first and second embodiments with reference to the drawings.

The magnetic shield cover for an encoder of magnetic detection type according to the first and second embodiments has a soft magnetic section and a non-magnetic section. The soft magnetic section is formed to cover a magnetic detection element and a magnet, and has an opening for avoiding a situation that a portion of the soft magnetic section prevents a magnetic field from the magnet from passing through the magnetic detection element. The non-magnetic section is provided in the opening of the soft magnetic section.

The soft magnetic section may be arranged in a portion where magnetic flux that is used for an operation of the magnetic detection element is less likely to be drawn, that is, a portion that is less likely to influence an operational magnetic field of the magnetic detection element. The non-magnetic section may be arranged in an area where the magnetic field that is used for the operation of the magnetic detection element is formed.

Accordingly, even when a distance between the magnetic detection element and the magnetic shield cover is set to be short, the magnetic shield cover for an encoder of magnetic detection type according to this embodiment is less likely to influence the magnetic field that is used for the original operation of the magnetic detection element. In addition, the magnetic shield cover for an encoder of magnetic detection type according to this embodiment can shield the external magnetic field.

First Embodiment

[Configurations of the Encoder of Magnetic Detection Type and the Magnetic Shield Cover]

Figure 2:
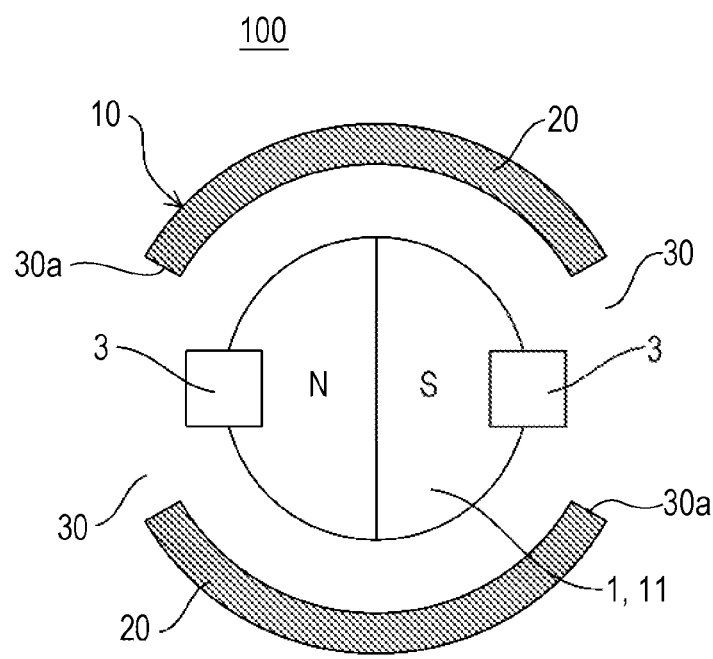
FIG. 2 is a horizontal cross-sectional view of the encoder of magnetic detection type according to the first embodiment.
Figure 3:
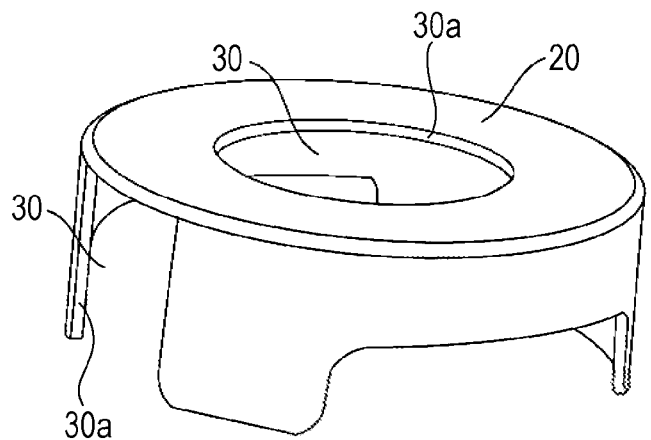
FIG. 3 is a perspective view of an external appearance configuration of a magnetic shield cover according to the first embodiment.

First, a description will be made on configurations of the encoder of magnetic detection type and the magnetic shield cover according to the first embodiment with reference to FIGS. 1 to 3. FIG. 1 is a vertical cross-sectional view of the encoder of magnetic detection type according to the first embodiment. FIG. 2 is a horizontal cross-sectional view of the encoder of magnetic detection type according to the first embodiment. FIG. 3 is a perspective view of an external appearance configuration of the magnetic shield cover according to the first embodiment.

The magnetic shield cover according to the first embodiment is used for the encoder of magnetic detection type. As depicted in FIG. 1, an encoder of magnetic detection type 100 includes a magnetic drum 1, a magnetic detection element 3, and a circuit board 4.

The magnetic drum (a magnet for detection) 1 has a magnet for forming a magnetic field that is used for an operation of the magnetic detection element 3 (which will be described below). The magnetic drum 1 is formed of a disc of a strong magnetic body, for example. The strong magnetic body is magnetized to have N and S magnetic poles at an equal interval, so as to be formed as a magnet 11. A rotary shaft 2 is provided at the center of a back surface of the disc of the strong magnetic body. The rotary shaft 2 is supported in a freely rotatable manner by a bearing that is provided in a bracket, which is not depicted.

The magnetic detection element 3 detects magnetism. The magnetic detection element 3 is an element for detecting a position of the magnetic pole that is magnetized to the magnetic drum 1 and converting the position to an electrical signal, for example. In this embodiment, the magnetic detection element 3 is provided to face the magnetic drum 1 with a gap being formed therebetween, for example.

The circuit board 4 is a board on which a circuit for processing the electrical signal of the magnetic detection element 3 is mounted. The magnetic detection element 3 is provided on the circuit board 4.

The magnetic drum 1, the magnetic detection element 3, and the circuit board 4 are covered with a magnetic shield cover 10 for shielding an external magnetic field. The magnetic shield cover 10 is a member of a substantially headed cylindrical body and has a soft magnetic section 20 and a non-magnetic section 30.

The soft magnetic section 20 is formed of a soft magnetic body like a soft steel sheet, a silicon steel sheet, or the like, for example. The soft magnetic section 20 has a function to shield the external magnetic field. More specifically, the soft magnetic section 20 is formed to cover the magnetic detection element 3 and the magnetic drum 1 (the magnet 11), for example. The soil magnetic section 20 has an opening 30a. The opening 30a avoids a situation that a part of the soft magnetic section 20 prevents a magnetic field from the magnet 11 from passing through the magnetic detection element 3. Thus, the soft magnetic section 20 (a portion thereof other than the opening 30a) is arranged in a portion that is less likely to influence the operation of the magnetic detection element 3. In addition, the opening 30a of the soft magnetic section 20 is formed by cutting out a part of the soft magnetic body as the soft magnetic section 20, for example.

The non-magnetic section 30 of this embodiment is formed of an air layer, for example. In this embodiment, for example, the air in the opening 30a of the soft magnetic section 20 constitutes the air layer as the non-magnetic section 30. In other words, the non-magnetic section 30 is provided in the opening 30a of the soft magnetic section 20.

The non-magnetic section 30 is arranged in an area of the magnetic shield cover 10 into which the magnetic field that should be used for the operation of the magnetic detection element 3 (the magnetic field that should pass through the magnetic detection element 3) is likely to be drawn. In other words, the non-magnetic section 30 is arranged in a part of the magnetic shield cover 10 into which magnetic flux MF of the magnet 11 is likely to be drawn. This part can be said as a part of the soft magnetic section 20 that is likely to prevent the magnetic field from the magnetic drum 1 from passing through the magnetic detection element 3, for example.

Figure 6:
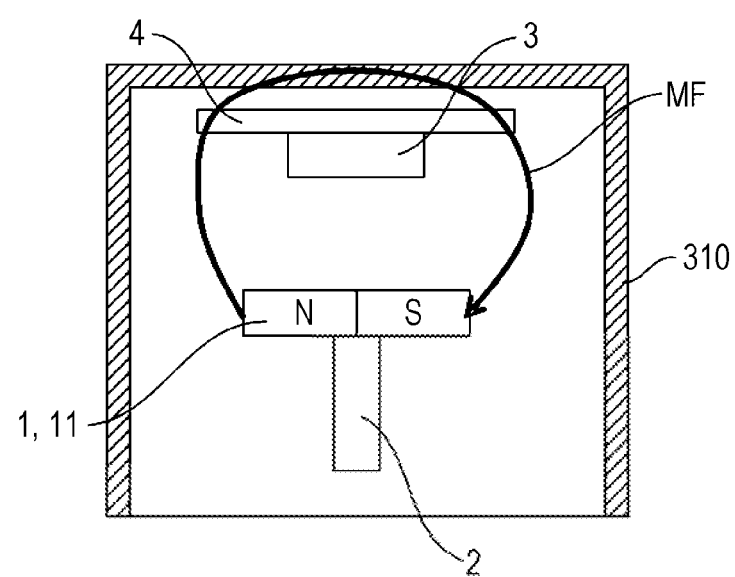
FIG. 6 is a view for explaining a flow of magnetic flux in the conventional magnetic shield cover.

In the case where the magnetic detection element 3 is arranged above the center of the magnetic drum 1, the magnetic flux of the magnet 11 is likely to be drawn into a central section of an upper surface of the magnetic shield cover 10 (the soft magnetic section 20) (see FIG. 6). Accordingly, in this case, as depicted in FIG. 1, the central section of the upper surface of the magnetic shield cover 10 (the soft magnetic section 20) is cut out. Thus, the opening 30a, that is, the air layer as the non-magnetic section 30 in the opening 30a is formed in this part. In order to form the opening 30a (the non-magnetic section 30), the central section of the upper surface of the magnetic shield cover 10 (the soft magnetic section 20) is cut out in a circular shape, for example.

In addition, as depicted in FIG. 2, in the case where the magnetic detection elements 3 and 3 are arranged to face each other in an outer peripheral section of the magnetic drum 1 in a plan view of the magnetic drum 1, the magnetic flux of the magnet 11 is likely to be drawn into lateral surface sections of the magnetic shield cover 10 (the soft magnetic section 20) in the vicinity of the magnetic detection elements 3 and 3. Accordingly, in this case, both of the lateral surface sections of the magnetic shield cover 10 (the soft magnetic section 20) in the vicinity of the magnetic detection elements 3 and 3 are cut out respectively, and thus the opening 30a, that is, the air layer as the non-magnetic section 30 in the opening 30a is formed in these parts. In order to form the opening 30a (the non-magnetic section 30), both of the lateral surface sections of the magnetic shield cover 10 (the soft magnetic section 20) are cut out in strip shapes, for example.

The magnetic shield cover 10 as depicted in FIG. 3 is completed by integrating the shapes of the magnetic shield cover 10 in FIGS. 1 and 2. More specifically, in the magnetic shield cover 10 in FIG. 3, the central section of the upper surface is cut out in the circular shape, and both of the lateral surface sections in the vicinity of the magnetic detection elements 3 and 3 are cut out in the strip shapes.

[Actions of the Encoder of Magnetic Detection Type and the Magnetic Shield Cover]

Figure 4:
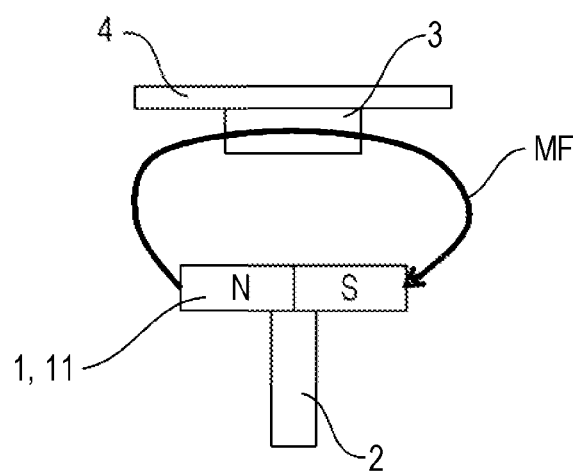
FIG. 4 is a view for explaining an original flow of magnetic flux.
Figure 5:
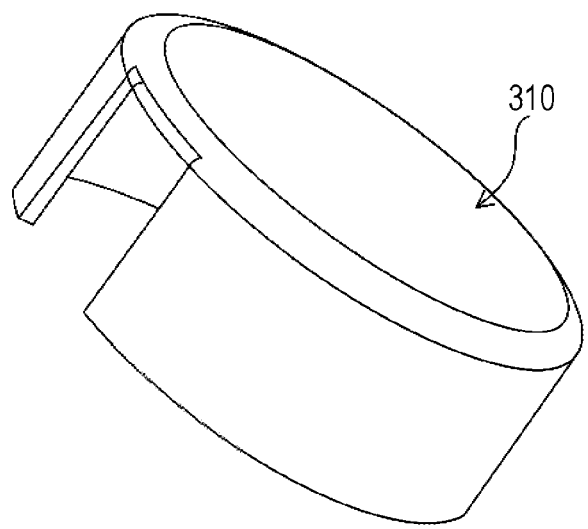
FIG. 5 is a perspective view of an external appearance configuration of a conventional magnetic shield cover.
Figure 7:
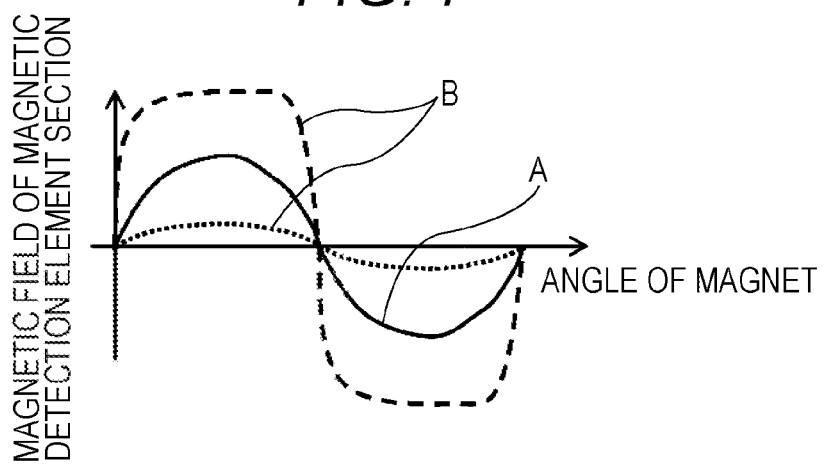
FIG. 7 is a graph for explaining a change in an operational magnetic field of a magnetic detection element.
Figure 8:
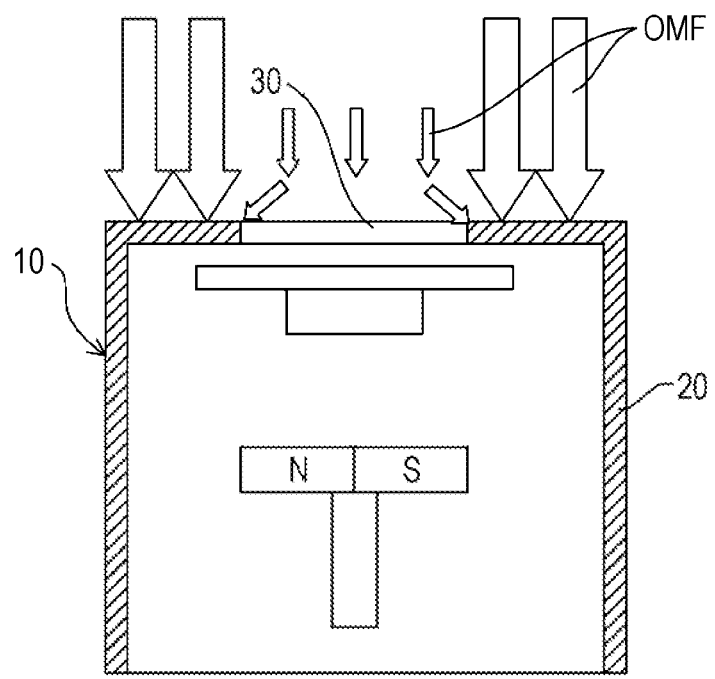
FIG. 8 is a view for explaining an external magnetic field shielding status of the magnetic shield cover according to the first embodiment.

Next, a description will be made on actions of the encoder of magnetic detection type and the magnetic shield cover according to the first embodiment with reference to FIGS. 1 to 8. FIG. 4 is a view for explaining an original (appropriate) flow of magnetic flux. FIG. 5 is a perspective view of an external appearance configuration of a conventional magnetic shield cover. FIG. 6 is a view for explaining a flow of magnetic flux in the conventional magnetic shield cover. FIG. 7 is a graph for explaining a change in an operational magnetic field of the magnetic detection element. FIG. 8 is a view for explaining an external magnetic field shielding status of the magnetic shield cover according to the first embodiment.

As depicted in FIG. 4, the magnetic drum 1 is magnetized to have N and S magnetic poles, and the magnet 11 is thus formed. The magnet 11 forms the magnetic flux MF that flows from the N pole to the S pole. The magnetic flux of the magnet 11 originally passes through the magnetic detection elements 3, each of which is provided to face the magnetic drum 1 with a space interposed therebetween.

The magnetic drum 1 rotates, and thus positions of the magnetic poles change. The magnetic detection element 3 detects the position of the magnetic pole that is magnetized to the magnetic drum 1 and converts the position to an electrical signal. The electrical signal of the magnetic detection element 3 is processed by the circuit board 4.

Conventionally, peripheries of the magnetic drum 1, the magnetic detection element 3, and the circuit board 4 are covered with a magnetic shield cover 310 as depicted in FIG. 5. The conventional magnetic shield cover 310 has a substantially bottomed cylindrical body, and the entirety thereof is formed of a soft magnetic body. In addition, the conventional magnetic shield cover 310 uniformly surrounds an encoder chamber, so as to shield an influence of external magnetism.

Accordingly, as depicted in FIG. 6, in the case where a distance between the magnetic shield cover 310 and the magnetic detection element 3 is short, the magnetic flux MF that should be used for the operation of the magnetic detection element 3 (the magnetic flux MF that should pass through the magnetic detection element 3) is possibly drawn into the magnetic shield cover 310. A fact that the magnetic flux MF that should be used for the operation of the magnetic detection element 3 is drawn into the magnetic shield cover 310 possibly influences a magnetic detection characteristic of the magnetic detection element 3.

FIG. 7 depicts a relationship between an angle of a magnet (the magnet 11, for example) and a magnetic field that passes through a magnetic detection element section (the magnet detection element 3, for example) in the case where the conventional magnetic shield cover is used. In FIG. 7, A indicates an original operational magnetic field, and B indicates an operational magnetic field that is changed by the influence of the magnetic shield cover. As depicted in FIG. 7, it can be understood that the operational magnetic field is deviated from the original operational magnetic field due to the influence of the conventional magnetic shield cover.

On the contrary, as depicted in FIGS. 1 to 3, the magnetic shield cover 10 according to this embodiment is the member of the substantially headed cylindrical body, and has the soft magnetic section 20 and the non-magnetic section 30. The soft magnetic section 20 is formed of the soft magnetic body, for example, and thus has the function to shield the external magnetic field.

Meanwhile, the non-magnetic section 30 is formed of the an layer, for example. The an layer is provided in the opening 30*a* of the soft magnetic section 20, the opening 30*a* being formed by cutting out the part of the soft magnetic body as the soft magnetic section 20. The non-magnetic section 30 (the opening 30*a*) is arranged in the part of the magnetic shield cover 10 (the soft magnetic section 20) into which the magnetic flux MF of the magnet 11 is likely to be drawn.

Accordingly, in the magnetic shield cover 10 according to this embodiment, even when the distance between the magnetic shield cover 10 and the magnetic detection element 3 is short, the magnetic field that is used for the original operation of the magnetic detection element 3 (the magnetic field that should pass through the magnetic detection element 3) is less likely to be influenced.

For this reason, in the magnetic shield cover 10 according to this embodiment, the distance between the magnetic shield cover 10 and the magnetic detection element 3 can be reduced. Thus, the magnetic shield cover 10 can be downsized. As a result, the encoder of magnetic detection type can be downsized.

In the magnetic shield cover 10 according to this embodiment, the soft magnetic section 20 is formed (arranged) in the portion that is away from the magnetic detection element 3 or the portion that is less likely to influence the operation of the magnetic detection element 3. The external magnetic field is actively concentrated in this soft magnetic section 20.

In the magnetic shield cover 10 according to this embodiment, degradation of a magnetic shielding ability caused by the non-magnetic section 30 is concerned. However, the non-magnetic section 30 exhibits higher magnetic resistance than the soft magnetic section 20. Accordingly, in the case where the external magnetic field acts on the non-magnetic section 30, most of magnetic flux OMF from the outside is drawn into the peripheral soft magnetic section 20. Thus, magnetic flux density in the vicinity of the non-magnetic section 30 is sufficiently lowered (see FIG. 8).

Therefore, the magnetic shield cover 10 according to this embodiment exhibits magnetic shielding performance that is equal to or higher than the conventional magnetic shield cover 310 that uniformly surrounds the encoder chamber.

In addition, in the first embodiment, the non-magnetic section 30 is the air layer that is provided in the opening 30*a*, the opening 30*a* being formed by cutting out the part of the soft magnetic section 20. Thus, the weight of the magnetic shield cover 10 can be reduced. As a result, the weight of the encoder of magnetic detection type can be reduced.

It should be noted that, in the first embodiment, the non-magnetic section 30 is the air layer in the opening 30*a*, for example. Thus, it can also be expressed that the non-magnetic section 30 is the air layer that is formed by cutting out the part of the soft magnetic section 20.

Second Embodiment

Figure 9:
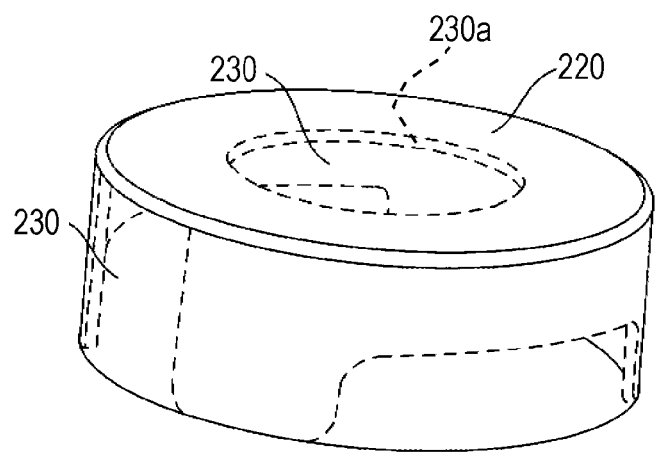
FIG. 9 is a perspective view of an example of a magnetic shield cover according to a second embodiment.
Figure 10:
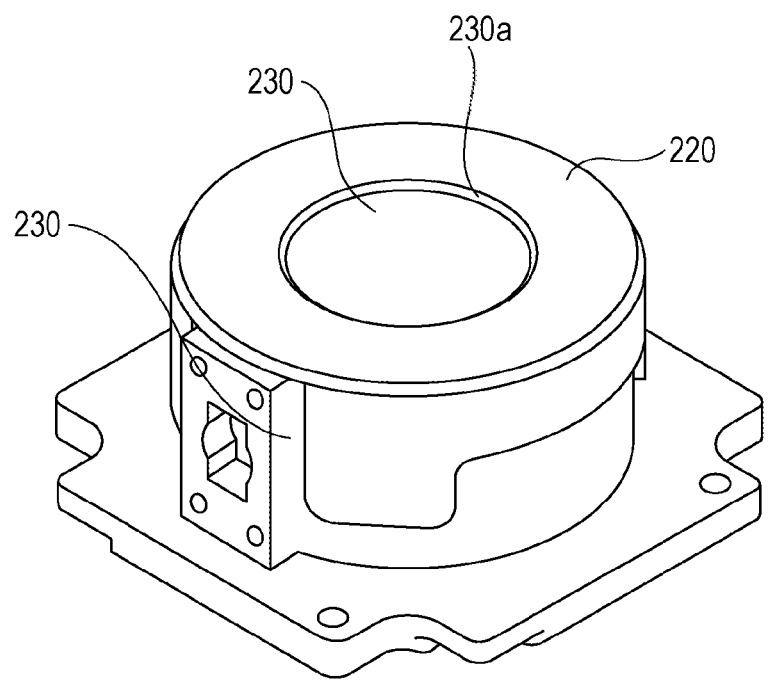
FIG. 10 is a perspective view of another example of the magnetic shield cover according to the second embodiment.

Next, a description will be made on configurations of a magnetic shield cover for an encoder of magnetic detection type and an encoder of magnetic detection type that includes the magnetic shield cover according to a second embodiment with reference to FIGS. 9 and 10. FIG. 9 is a perspective view at an example of the magnetic shield cover according to the second embodiment. FIG. 10 is a perspective view of the other example of the magnetic shield cover according to the second embodiment.

The encoder of magnetic detection type according to the second embodiment differs from the first embodiment in a point that a magnetic shield cover 210 of a compound body structure is included.

More specifically, the magnetic shield cover 210 according to the second embodiment includes a soft magnetic section 220 and a non-magnetic section 230.

The soft magnetic section 220 is formed of a soft magnetic body like a soft steel sheet, a silicon steel sheet, or the like, for example. The soft magnetic section 220 is formed to cover the magnetic detection element 3 and the magnetic drum 1, for example. The soft magnetic section 220 is formed of the soft magnetic body that has the same shape as the shape depicted in FIG. 3, for example. In other words, the soft magnetic section 220 has an opening 230*a* to avoid a situation that a part of the soft magnetic section 220 prevents the magnetic field from the magnet 11 from passing through the magnetic detection element 3. Thus, the soft magnetic section 220 (a portion thereof other than the opening 230*a*) is arranged in a portion that is less likely to influence the operation of the magnetic detection element 3. In addition, the opening 230*a* of the soft magnetic section 220 is formed by cutting out a part of the soft magnetic body as the soft magnetic section 220, for example.

Furthermore, the magnetic shield cover 210 depicted in FIG. 9 includes a synthetic resin material (a synthetic resin material body) in a headed cylindrical shape that is attached to an outer side of the soft magnetic section 220. Then, a part of the synthetic resin material (the synthetic resin material body) that corresponds to the opening 230*a* of the soft magnetic section 220 serves as the non-magnetic section 230 in the magnetic shield cover 210. Accordingly, in the magnetic shield cover 210 depicted in FIG. 9, the non-magnetic section 230 is attached to the soft magnetic section 220 so as to cover the opening 230*a* of the soil magnetic section 220. While the synthetic resin material is present in the non-magnetic section 230, the soft magnetic body is not present therein. Just as described, in this embodiment, the non-magnetic section 230 is formed of the synthetic resin material. The synthetic resin material that is a material of the non-magnetic section 230 is not limited and appropriately selected from well-known synthetic resin materials.

In addition, the magnetic shield cover 210 depicted in FIG. 10 includes synthetic resin material (a synthetic resin material body) in a headed cylindrical shape that is attached to an inner side of the soft magnetic section 220. Then, a part of the synthetic resin material that corresponds to the opening 230*a* of the soft magnetic section 220 serves as the non-magnetic section 230 in the magnetic shield cover 210. Accordingly, in the magnetic shield cover 210 depicted in FIG. 10, the non-magnetic section 230 is attached to the soft magnetic section 220 so as to cover the opening 230*a* of the soft magnetic section 220. While the synthetic resin material is present in the non-magnetic section 230, the soft magnetic body is not present therein.

It should be noted that the synthetic resin material (the synthetic resin material body) in the headed cylindrical body depicted in FIGS. 9 and 10 may have an integral shape that covers the plural openings 230a in the soft magnetic section 220.

The magnetic detection element 3 and the magnetic drum 1 are housed in the magnetic shield cover 210 depicted in FIGS. 9 and 10, the magnetic detection element 3 detecting the magnetism, and the magnetic drum 1 having the magnet 11 for forming the magnetic field that is used for the operation of the magnetic detection element (the magnetic field that passes through the magnetic detection element 3) (see FIG. 1).

The encoder of magnet detection type and the magnetic shield cover 210 according to the second embodiment basically have the same action and effect as the encoder at magnetic detection type 100 and the magnetic shield cover 10 according to the first embodiment.

Particularly, according to the second embodiment, the magnetic shield cover 210 has the compound body structure, and the synthetic resin material covers the entire encoder chamber. Thus, the second embodiment exhibits such an advantageous effect that can prevent or suppress entry of a foreign object such as dust into the encoder chamber.

A preferred embodiment of the present disclosure is described above. However, the foregoing description is intended only for illustration of the present disclosure, and is not intended to limit the technical scope of the present disclosure to the foregoing embodiment. The technique of the present disclosure can be carried out in various modes different from the foregoing embodiment without deviating from the gist of the present disclosure.

It should be noted that, in the magnetic shield cover 210 according to the second embodiment, the soft magnetic section 220 may be formed of the soft magnetic body like the soft steel sheet, a silicon steel sheet, or the like. Meanwhile, non-magnetic section 230 may be formed of the synthetic resin material. The synthetic resin material is not limited but is appropriately selected from the well-known synthetic resin materials. In the magnetic shield cover 210 depicted in FIG. 9, the synthetic resin material in the headed cylindrical body shape may be attached to the outer side of the of magnetic body that has the same shape as FIG. 2. In the non-magnetic section 230, only the synthetic resin material may be present, and the soft magnetic body may not be present. In the magnetic shield cover 210 depicted in FIG. 10, the synthetic resin material in the headed cylindrical body shape may be attached to the inner side of the soft magnetic body that has the same shape as FIG. 2. In the non-magnetic section 230, only the synthetic resin material may be present, and the soft magnetic body may not be present. The magnetic detection element and the magnetic drum may be housed in the magnetic shield cover 210 depicted in FIGS. 9 and 10, the magnetic detection element detecting the magnetism, and the magnetic drum having the magnet for forming the magnetic field required for the operation of the magnetic detection element. Each of these configurations basically exhibit the same action and effect as those exhibited by the encoder of magnetic detection type 100 and the magnetic shield cover 10 according to the first embodiment.

In addition, the magnetic shield over for an encoder of magnetic detection type and the encoder of magnetic detection type according to the embodiments of the present disclosure may respectively be either one of the first to fifth magnetic shield covers for an encoder of magnetic detection type and the first encoder of magnetic detection type, which will be described below.

The first magnetic shield cover for an encoder of magnetic detection type is a magnetic shield cover for an encoder of magnetic detection type that covers a magnetic detection element and a magnetic drum, that has a soft magnetic section and a non-magnetic section, in which the soft magnetic section is arranged in a portion that does not influence an operational magnetic field of the magnetic detection element, and in which the non-magnetic section is arranged in an area where a magnetic field required for an operation of the magnetic detection element is formed, the magnetic detection element detecting magnetism, and the in magnetic drum having a magnet for forming the magnetic field required for the operation of the magnetic detection element.

The second magnetic shield cover for an encoder of magnetic detection type is the first magnetic shield cover for an encoder of magnetic detection type in the soft magnetic section is formed of a soft magnetic body, and in which the non-magnetic on is formed of an air layer.

The third magnetic shield cover for an encoder of magnetic detection type is the second magnetic shield cover for an encoder of magnetic detection type in which the air layer is formed by cutting out a part of the soft magnetic body.

The fourth magnetic shield cover for an encoder of magnetic detection type is the first magnetic shield cover for an encoder of magnetic detection type in which the soft magnetic section is formed of a soft magnetic body and in which the non-magnetic section is formed of a synthetic resin material.

The fifth magnetic shield cover for an encoder of magnetic detection type is the fourth magnetic shield cover for an encoder of magnetic detection type that is constructed of a compound body in which the synthetic resin material is attached to an outer side or an inner side of the soft magnetic body and in which the soft magnetic body is not present in the non-magnetic section.

In the first encoder of magnetic detection type, the magnetic detection element and the magnetic drum are covered with any one of the first to fifth magnetic shield covers for an encoder of magnetic detection type, the magnetic detection element detecting the magnetism, and the magnetic drum having the magnet for forming the magnetic field required for the operation of the magnetic detection element.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A magnetic shield cover for an encoder of magnetic detection type, comprising a soft magnetic section and a non-magnetic section, wherein
the soft magnetic section is formed to cover a magnetic detection element and a magnet,
the non-magnetic section is a circular cutout of a part of the soft magnetic section, the magnet is supported by a rotary shaft,
the magnetic detection element is provided on an axis of rotation of the rotary shaft,
the cutout is provided on the axis of rotation of the rotary shaft,
the cutout consists of air or a synthetic resin material,
the encoder comprises, from upper to lower in a direction of the axis of rotation of the rotary shaft, the cutout, the magnetic detection element, the magnet, and the rotary shaft,
the soft magnetic section has a cylindrical shape, and
the magnet and the rotary shaft rotate relative to the soft magnetic section.

2. The magnetic shield cover for an encoder of magnetic detection type according to claim 1, wherein
the soft magnetic section is formed of a soft magnetic body, and
the cutout consists of the air.

3. The magnetic shield cover for an encoder of magnetic detection type according to claim 1, wherein
the soft magnetic section is formed of a soft magnetic body, and
the cutout consists of the synthetic resin material.

4. The magnetic shield cover for an encoder of magnetic detection type according to claim 1, wherein
the soft magnetic section has a headed cylindrical shape having a lateral surface and an upper surface; and
the cutout is provided at a center of the upper surface.

5. The magnetic shield cover for an encoder of magnetic detection type according to claim 1, wherein
the cylindrical shape of the soft magnetic section has a side surface and an upper circular surface; and
the cutout is provided at a center of the upper circular surface.

6. The magnetic shield cover for an encoder of magnetic detection type according to claim 1, wherein
the magnetic detection element is on a circuit board, and
an upper circular surface of the soft magnetic section overlaps, in a direction parallel to the direction of the axis of rotation, with a part of the circuit board.

7. The magnetic shield cover for an encoder of magnetic detection type according to claim 1, wherein
the soft magnetic section consists of a cylindrical side surface and an upper circular surface, the cylindrical side surface being parallel to the axis of rotation of the rotary shaft, the upper circular surface being perpendicular to the axis of rotation, and
the non-magnetic section is the cutout of the upper circular surface.

8. An encoder of magnetic detection type, comprising:
a magnetic detection element that detects magnetism;
a magnetic drum that has a magnet for forming a magnetic field used for an operation of the magnetic detection element, the magnet drum being supported by a rotary shaft; and
a magnetic shield cover comprising a soft magnetic section and a non-magnetic section, wherein
the soft magnetic section is formed to cover the magnetic detection element and the magnet drum,
the soft magnetic section has a cylindrical shape having a side surface and an upper circular surface, the side surface being parallel to an axis of rotation of the rotary shaft, the upper circular surface being perpendicular to the axis of rotation of the rotary shaft;
the non-magnetic section is a circular cutout of a part of the upper circular surface of the soft magnetic section;
the circular cutout is provided at a center of the upper circular surface and on the axis of rotation of the rotary shaft,
the magnetic detection element is provided on the axis of rotation of the rotary shaft,
the circular cutout consists of air or a synthetic resin material,
the encoder comprises, from upper to lower in a direction of the axis of rotation of the rotary shaft, the circular cutout, the magnetic detection element, the magnetic drum, and the rotary shaft, and
the magnetic drum and the rotary shaft rotate relative to the soft magnetic section.

9. The encoder of magnetic detection type according to claim 8, wherein
the circular cutout consists of the air.

10. The magnetic shield cover for an encoder of magnetic detection type according to claim 8, wherein
the magnetic detection element is on a circuit board, and
the upper circular surface of the soft magnetic section overlaps, in a direction parallel to the direction of the axis of rotation, with a part of the circuit board.

11. The magnetic shield cover for an encoder of magnetic detection type according to claim 8, wherein
the soft magnetic section consists of the side surface and the upper circular surface.

* * * * *